(12) United States Patent
Gühring et al.

(10) Patent No.: US 7,372,268 B2
(45) Date of Patent: May 13, 2008

(54) METHOD AND DEVICE FOR DETERMINATION OF COEFFICIENTS OF A MAGNETIC RESONANCE DIFFUSION TENSOR

(75) Inventors: Jens Gühring, Langensendelbach (DE); Stefan Thesen, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 142 days.

(21) Appl. No.: 11/471,749

(22) Filed: Jun. 20, 2006

(65) Prior Publication Data

US 2007/0038072 A1    Feb. 15, 2007

(30) Foreign Application Priority Data

Jun. 20, 2005    (DE)    ............... 10 2005 028 475

(51) Int. Cl.
G01V 3/00    (2006.01)
(52) U.S. Cl. ............... 324/307; 324/309; 600/410
(58) Field of Classification Search ............... 324/307, 324/309
See application file for complete search history.

(56) References Cited

U.S. PATENT DOCUMENTS

| 5,539,310 | A | | 7/1996 | Basser et al. | |
|---|---|---|---|---|---|
| 5,833,609 | A | * | 11/1998 | Dannels et al. | 600/410 |
| 6,891,373 | B2 | * | 5/2005 | Deimling | 324/309 |
| 7,078,897 | B2 | * | 7/2006 | Yablonskiy et al. | 324/307 |

FOREIGN PATENT DOCUMENTS

WO    WO 99/63355    12/1999

OTHER PUBLICATIONS

"Incremental Singular Value Decomposition of Uncertain Data With Missing Values," Brand, Proc. Of The 2002 European Conference On Computer Vision, Springer Lecture Notes In Computer Science, vol. 2350 (May 2002).
"A Simplified Method to Measure the Diffusion Tensor From Seven MR Images," Basser et al, Magnetic Resonance In Medicine, vol. 39 (1998) pp. 926-934.
"PowerFactorization: 3D Reconstruction With Missing or Uncertain Data," Hartley, Australia-Japan Advanced Workshop On Computer Vision, Sep. 9-11, 2003, pp. 1-9.
"Analytical Error Propagation in Diffusion Anisotropy Calculations," Poonawalla et al, Journal of Magnetic Resonance Imaging, vol. 19 (2004), pp. 489-498.

* cited by examiner

Primary Examiner—Brij Shrivastav
Assistant Examiner—Megann E Vaughn
(74) Attorney, Agent, or Firm—Schiff Hardin LLP

(57) ABSTRACT

In a method and apparatus for determination of coefficients of a diffusion tensor to describe a diffusion process within a subject, spatially-resolved, variously diffusion-coded diffusion data are generated from volume elements of the subject under consideration of control data for various diffusion codings. Intermediate diffusion data are generated for each volume element from diffusion data measured with a first diffusion coding. Updated intermediate diffusion data are then determined for each volume element from diffusion data generated preceding the intermediate diffusion data and current diffusion data measured with a different diffusion coding. Components of a diffusion tensor are determined from the last determined, updated intermediate diffusion data after multiple updates with various diffusion codings.

18 Claims, 2 Drawing Sheets

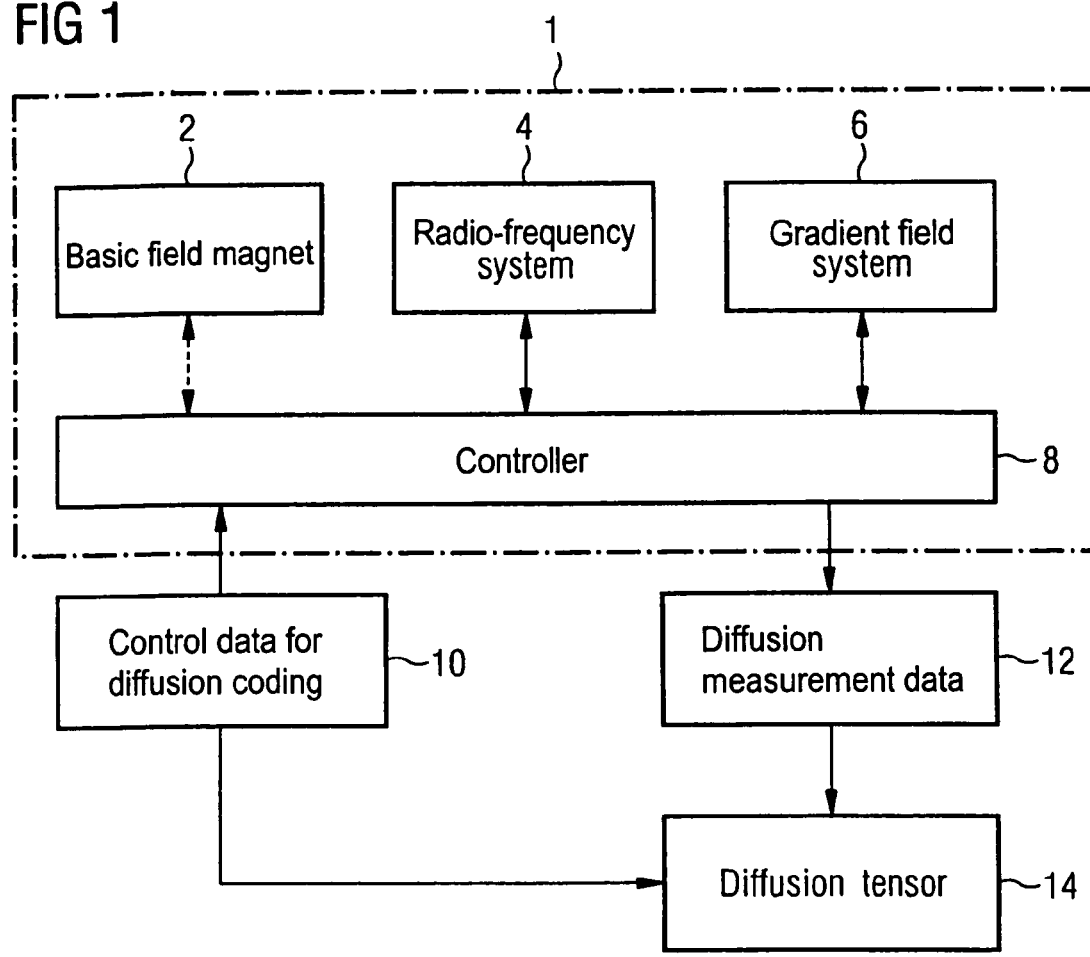

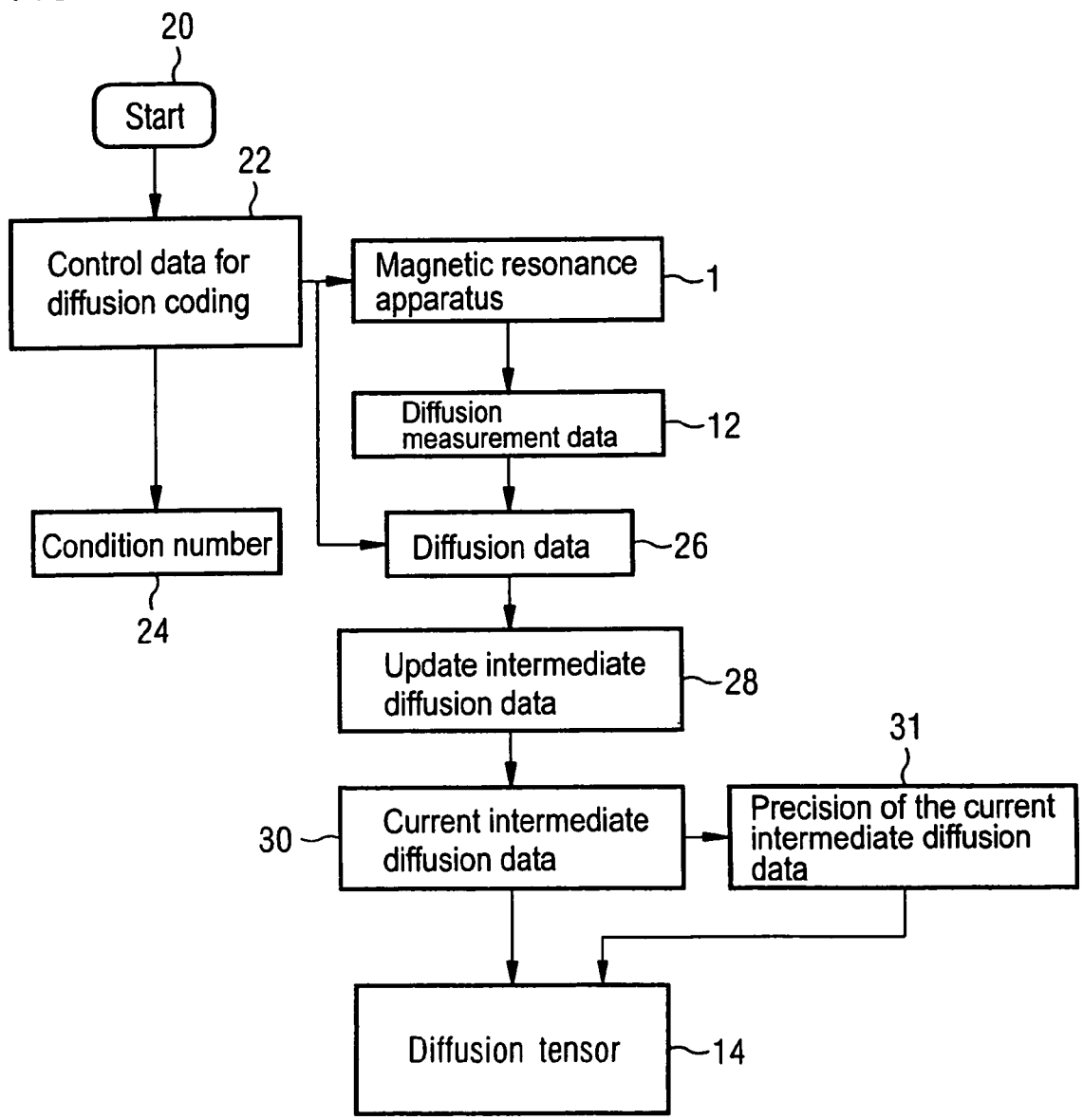

METHOD AND DEVICE FOR DETERMINATION OF COEFFICIENTS OF A MAGNETIC RESONANCE DIFFUSION TENSOR

BACKGROUND OF THE INVENTION

1. Field of the Invention

The present invention concerns a method for determination of coefficients of a diffusion tensor by means of magnetic resonance for description of a diffusion process within a subject, in which spatially-resolved, variously diffusion-coded diffusion data are generated from volume elements of the subject dependent on control data for various diffusion codings in chronological order.

The invention likewise concerns a device for implementation of the method.

2. Description of the Prior Art

A method and a device of the aforementioned type are known from U.S. Pat. No. 5,539,310. The method specified therein is based on a magnetic resonance measurement sequence proposed by Stejskal and Tanner in 1965. The method described in U.S. Pat. No. 5,539,310 expands the measurement sequence proposed by Stejskal and Tanner such that coefficients or elements of a diffusion tensor are determined and graphically represented for each voxel in an examination region. A clear representation with a diffusion ellipsoid, the main axis of which represents the direction of the strongest diffusion process, ensues. The expansion in the individual directions stands for a numerical value of the diffusion process in the corresponding directions. In medical applications, the relative mobility of water molecules in endogenic tissue can thus be measured with magnetic resonance diffusion imaging. Since the diffusion in the tissue can depend on its structure (such as, for example, the fiber direction), medically-relevant conclusions can be derived from the diffusion tensor.

The diffusion data are determined in the magnetic resonance measurement from the size and direction of the diffusion gradient fields used for diffusion coding. Strong gradient pulses are thereby used that are oriented symmetrically to a radio-frequency, 180° refocusing pulse. The first gradient pulse before the 180° refocusing pulse generates a phase shift for all spins; the second gradient pulse inverts this phase shift. Given stationary molecules (protons in medical imaging), the phase shift therewith cancels again. However, for molecules that, due to Brownian motion, are located at a different location during the effect of the second gradient pulse than during the effect of the first gradient pulse, the phase shift is not completely compensated. A rest phase displacement remains that leads to a signal attenuation. The diffusion coding can be controlled by the size and direction of such gradient pulses.

In medical diffusion tensor measurement by means of magnetic resonance techniques and the subsequent graphical representation (DTI=Diffusion Tensor Imaging), large quantities of measurement data accumulate, from which the sought six tensor parameters or tensor coefficients (thus the independent elements or components of a symmetrical 3×3 tensor matrix) are calculated per voxel. The tensor parameters are subsequently used to calculate relevant parameter cards for the diagnostics. For example, the isotropic portion of the diffusion tensor or the anisotropic portion of the diffusion tensor is displayed in corresponding parameter cards (Average Apparent Diffusion Coefficient Map or ADCav Map, or Fractional Anisotropy Map or FA Map). Due to the large amount of measurement data, the calculation of the diffusion tensor per voxel requires the determination of the unknown parameters by means of a compensation. Methods known from multi-variant linear regression are used, for example methods that form a pseudo-inverse or implement a singular value decomposition. These methods are, however, very storage-space intensive and computationally complex because all data for the evaluation are retained in the known methods and the sought parameters are only determined by means of compensation methods after conclusion of the measurement. Rules for accounting for the intensity values are also applied as alternatives for specific, rigid sets of diffusion codings. However, such methods are very inflexible.

SUMMARY OF THE INVENTION

An object of the present invention is to provide a method and a device in which a flexible evaluation in DTI is possible and the required storage space capacity is reduced.

The object is achieved in accordance with the invention by a method wherein intermediate diffusion data are thereby generated for each volume element from diffusion data measured with a first diffusion coding, updated intermediate diffusion data are determined for each volume element from diffusion data generated preceding the intermediate diffusion data and current diffusion data measured with a different diffusion coding, and components of a diffusion tensor are determined from the last determined, updated intermediate diffusion data after multiple updates with various diffusion codings.

The incoming measurement values can be processed immediately and used for updating the intermediate diffusion data with this incremental method. The tensor components can be determined from the last updated intermediate data with small processing steps that are not very calculation-intensive. It is accordingly not necessary (as in the prior art) for all measurement values to be initially determined and stored in memory before the evaluation can begin. The necessary storage requirement is significantly reduced in the inventive method. Parts of the calculations can already be implemented in parallel with the data acquisition; the time required after the measurement for the calculation of the results is likewise significantly reduced. The calculations still remaining after conclusion of the measurement no longer directly use to the measurement data. The calculation is deconstructed into parts which require an access to the measurement data and parts that can be started with intermediate results.

In one embodiment the intermediate diffusion data and the updated intermediate diffusion data are determined by means of a normal smoothing method using the Moore-Penrose pseudo-inverse. For each partial measurement, thus for each measurement with a specific diffusion coding, this method requires only information for and from this partial measurement. It is therefore in principle possible to determine diffusion components even after an unforeseen termination of the measurement. The precision of the results then naturally depends on the quality of the measurement data.

In a further embodiment the intermediate diffusion data and updated intermediate diffusion data are determined by means of a singular value decomposition method. Here information is in fact required regarding all diffusion codings, such as the number of the measurements times the six diffusion components to be determined; in spite of this, an incremental processing of the measurement data is also possible here with a correspondingly-reduced memory and computation requirement.

In both of these embodiments, standard methods for matrix calculation from linear algebra can be used that are available in highly-optimized standard libraries or that can be embodied in hardware extensions of modern processors.

In a further embodiment, a diffusion-coding effect of imaging gradient fields is additionally taken into account to determine the components of the diffusion tensor. An improvement of the quality of the diffusion tensor components so determined is connected with this since all gradient fields influencing the diffusion coding are taken into account as well.

In another embodiment, the diffusion data are generated in chronological order such that diffusion data that strongly determine the components of the diffusion tensor are generated first and those that weakly determine the components of the diffusion tensor are generated afterwards. A first approximation for the components of the diffusion tensor thus can already be calculated after a short measurement time. Such a measurement order is additionally tolerant of an early measurement termination.

In a further embodiment, a signal is output when the components of the diffusion tensor can be determined with a predetermined precision. In another embodiment the performance of the components is determined and is output as a quality measure.

In a further embodiment, a condition number is determined from the control data as a measure for the determinability of the components.

DESCRIPTION OF THE DRAWINGS

FIG. 1 schematically shows a diagnostic magnetic resonance apparatus with the basic components for determination of a diffusion tensor and, FIG. 2 is a block diagram showing the basic steps of a method for determination of components of a diffusion tensor in accordance with the invention.

DESCRIPTION OF THE PREFERRED EMBODIMENTS

The diffusion behavior of living tissue gives important information regarding its microstructure. Such diffusion processes can be described by a diffusion tensor the components of which are determined with the aid of magnetic resonance technique. Diffusion-coded or diffusion-weighted magnetic resonance signals can be generated with diagnostic magnetic resonance apparatuses known today.

The diffusion-weighted magnetic resonance signal can thus be described according to the following formula.

$$S = S_0 e^{-bD} \quad (1)$$

$S_0$ is thereby the initial signal strength without diffusion-weighted gradient pulses b is thereby the diffusion weighting factor D is the diffusion coefficient, also designated as ADC (apparent diffusion coefficient).

Only tissue with isotropic diffusion properties can be described in the diffusion coefficients D according to equation (1). In order to also be able to detect the case of an anisotropic diffusion, the equation 1 is expanded as follows:

$$S = S_0 e^{-bg^T Dg} \quad (2)$$

wherein D is the symmetrical 3×3 diffusion tensor.

$$D = \begin{pmatrix} D_{xx} & D_{xy} & D_{xz} \\ & D_{yy} & D_{yz} \\ & & D_{zz} \end{pmatrix} \quad (3)$$

and $$g = g_{diff} / |g_{diff}| \quad (4)$$

describe the normalized diffusion-coded gradient vector. $D_{xx}$, $D_{xy}$, $D_{xz}$, $D_{yy}$, etc. are the individual components or elements of the diffusion tensor. These are also sometimes designated as tensor parameters.

The effect of the gradients used can be described by the introduction of a diffusion matrix B. This is developed as follows:

$$\begin{aligned} S &= S_0 e^{-bg^T Dg} \quad (5) \\ &= S_0 e^{-b\langle gg^T, D\rangle} \\ &= S_0 e^{-\langle bG, D\rangle} \\ &= S_0 e^{-\langle B, D\rangle} \\ &= S_0 \exp\left[-\sum_{k=1}^{3}\sum_{l=1}^{3} B_{kl} D_{kl}\right] \end{aligned}$$

Instead of the index of the coordinate directions x, y and z, a number index 1, 2 and 3 has been analogously employed here for reasons of the simpler representation in a formula. With the B matrix it is possible to take all diffusion imaging gradients as well as their cross terms into account in the measurement sequence.

At least six measurements with various diffusion coding directions are necessary in order to determine the diffusion tensor. The elements of the diffusion tensor and the T2-weighted signals $S_0$ for each voxel from the measurement region or the examination region can be determined with an additional measurement without the effect of diffusion gradients (baseline image).

In the event that more than seven measurements are implemented (this is desirable for reasons of the then-better signal-to-noise ratio), the coefficients are determined such that the errors then resulting are minimal. The following correlations thereby result.

Measurements or Observations:

Number of the measurements $n$ \hfill (6)

Measurement vector: $1^T = (l_1 \ldots l_n) = (\ln S_1 \ldots \ln S_n)$ \hfill (7)

Measurement equation: 
$$\begin{aligned} \ln S_i + v_i &= \ln S_0 - \langle B_i, D\rangle \\ &= \ln S_0 - B_{xx_i} D_{xx} - B_{yy_i} D_{yy} - \quad (8) \\ &\quad B_{zz_i} D_{zz} - 2B_{xy_i} D_{xy} - \\ &\quad 2B_{xz_i} D_{xz} - 2B_{yz_i} D_{yz} \end{aligned}$$

Unknowns:

(9) Number of the unknowns: u=7

Vector of the Unknowns:

$$x^T=(x_1 \ldots x_u)=(D_{xx}, D_{xy}, D_{xz}, D_{yy}, D_{yz}, D_{zz}, \ln S_0) \quad (10)$$

Redundancy of the Equation System: $r=n-u$ (11)

Solution Models:

Model function: $l+v=Ax$ (12)

Target Function for the Improvement v:

$$v^T v \to \min \quad (13)$$

Solution $$x=(A^T A)^{-1} A^T l = N^{-1} n \quad (14)$$

Design Matrix:

$$A_{ij} = \left( \frac{\delta l_i}{\delta x_j} \right) \quad (15)$$

with the partial derivatives $$\frac{\delta l_i}{\delta x_1} = \frac{\delta l_i}{\delta D_{xx}} = -B_{xx} \quad \frac{\delta l_i}{\delta x_2} = \frac{\delta l_i}{\delta D_{xy}} = -2B_{xy} \quad \frac{\delta l_i}{\delta x_3} = \frac{\delta l_i}{\delta D_{xz}} = -2B_{xz}$$

$$\frac{\delta l_i}{\delta x_4} = \frac{\delta l_i}{\delta D_{yy}} = -B_{yy} \quad \frac{\delta l_i}{\delta x_5} = \frac{\delta l_i}{\delta D_{yz}} = -2B_{yz} \quad \frac{\delta l_i}{\delta x_6} = \frac{\delta l_i}{\delta D_{zz}} = -B_{zz} \quad (16)$$

$$\frac{\delta l_i}{x_7} = \frac{\delta l_i}{\delta (\ln S_0)} = 1$$

The diffusion tensor is normally specified in a patient coordinate system. For continuing analyses it can be advantageous to implement a coordinate transformation in a coordinate system whose main axes correspond to the directions of the eigenvector of the tensor. For this purpose it is necessary to implement an eigenvalue-eigenvector decomposition of the diffusion matrix D.

$$D = (e_1 \; e_2 \; e_3) \begin{pmatrix} \lambda_1 & 0 & 0 \\ 0 & \lambda_2 & 0 \\ 0 & 0 & \lambda_3 \end{pmatrix} (e_1 \; e_2 \; e_3)^T \quad (17)$$

$$= \lambda_1 e_1 e_1^T + \lambda_2 e_2 e_2^T + \lambda_3 e_3 e_3^T$$

with $e_i$: uniform eigenvector in the directions 1, 2, 3
$e_1$: main diffusion directions
$\lambda_i$: diffusity in the direction of $e_i$, ($\lambda_1 \geq \lambda_2 \geq \lambda_3$)

The inverse normal equation matrix $N^{-1}$ contains information about the precision of the unknown tensor elements and the estimated $S_0$ values $$\Sigma_{xx} = \frac{1}{\sigma_0^2} N^{-1} \quad (18)$$

with $$\sigma_0^2 = \frac{v^T v}{n-u} \quad (19)$$

The matrix $\Sigma_{xx}$ is entirely determined by the gradient pulses for diffusion coding. It supplies information about the form of the uncertainties or the spatial conformation (shape) of the uncertainties.

The scalar $\sigma_0^2$ changes from pixel to pixel and supplies information about the performance of the adaptation of the tensor model with the measurement data.

A condition number of the normal equation matrix can be used as a measure for whether the equation (14) leads to a stable solution with the present data. The calculation of the condition number merely requires the control data for the diffusion coding. A matrix is singular (thus not solvable) when its condition number is infinite. It is poorly conditioned when its condition number is large. This is synonymous with the situation that the reciprocity value of the condition number approximates the floating point precision of the calculation method used. A higher value for the condition number therewith indicates an assertion about a poor planning quality of the measurement method. Known methods can be used to determine the condition number.

A first realization of the incremental determination of the matrix N and of the vector n is derived in the following. First introduce a vector $a_i$; i=1 . . . n $$a_i^T = \left( \frac{\delta l_i}{\delta x_1} \; \frac{\delta l_i}{\delta x_1} \; \ldots \; \frac{\delta l_i}{\delta x_1} \right) \quad (20)$$

is defined using the partial derivations-of the equations (16).

After each measurement of the examination area the matrix $n_i$ can be updated because the correlation $$N_i = N_{i-1} + a_i a_i^T \quad (21)$$

exists. The vector n can additionally be updated for each voxel according to the correlation $$n_i(x,y,z) = n_{i-1}(x,y,z) + \ln S_i(x,y,z) a_i \quad (22)$$

The required updates after each measured image or volume (i.e. after each diffusion coding) are composed of only some few simple operations involving the vector $a_i$ and the matrix $N_i$, including calculating seven multiplications and additions per voxel. The reason is in that the vector $a_i$ remains unchanged per measured image or volume. These calculation operations can also be implemented during the measurement (inline).

After all images/volumes are measured with the individual diffusion codings and the measurement values are further processed corresponding to the equations (21) and (22) specified in the preceding, the matrix $N_i$ is identical to the matrix N and the vector $n_i$ is identical to the vector n in the equation (14). After inversion of the matrix N, the unknown tensor components can be determined for each voxel corresponding to equation (14).

A value for the precision of the current intermediate diffusion data can likewise be determined as follows. The variance of the unit of weight can be calculated per pixel, as is indicated in the preceding in equation (19). In the event that the components of the vector v are not required, an efficient incremental solution for this can be specified. Starting from the equations (12) and (19), $$v^T v = (Ax-1)^T (Ax-1) \quad (23)$$

$$= \underbrace{x^T A^T A x}_{I} - \underbrace{2 x^T A^T 1}_{II\;III} + \underbrace{1^T 1}_{IV}$$

can be derived. The discussion of the equation (23) supplies four components:

I: $x^T A^T A x$ This component contains the normal equation matrix $N = A^T A$ and the solution vector x. Both the matrix and the solution vector have already been calculated in connection with the incremental solution that is specified in equation 20-22.

II: $2x^T$ This component contains the solution vector x which, as already specified above, was already determined as part of the incremental solution.

III: $A^T I$ This component has likewise already been calculated as above.

IV: $I^T I$ Only this component must be additionally calculated and stored.

As stated in the preceding, the solution for $\hat{\sigma}_0^2$ can be calculated incrementally. The single additional data that must still be determined is a sum of the quadratic values of In $S_i(x, y, z)$.

In a further embodiment, a singular-value decomposition (SVD) is used for incremental calculation of the elements of the diffusion tensor. The singular-value decomposition also finds a minimal error quadratic solution of an over-determined equation system. In principle, each M·N matrix A whose number of the rows M is greater than or equal to the number of the columns N can be specified as a product of an M·N column-orthogonal matrix U, an M·N diagonal matrix W with positive or zero elements (the singular values) and the transposes of an N·N orthogonal matrix V.

$$(A) = (U) \cdot \begin{pmatrix} w_1 & & & \\ & w_1 & & \\ & & \ddots & \\ & & & \ddots \\ & & & & w_N \end{pmatrix} \cdot (V^T) \quad (24)$$

The smallest error quadratic solution for equation (12) is specified as follows with equation (25), whereby the matrix $A^+$ represents what is known as the Moor-Penrose or pseudo-inverse matrix:

$$(x) = (V) \cdot (\mathrm{diag}(1/w_j)) \cdot (U^T) \cdot (1) = A^+ \cdot 1 \quad (25)$$

As has already been described in the preceding, the elements of the matrix A can be determined in equation 12 from the control data for the diffusion measurement, thus from the measurement protocol. These data are independent of the measurement values. The pseudo-inverse matrix $A^+$ can be determined before the actual data acquisition as a result of thus. The solution vector x can now be calculated incrementally and pixel-by-pixel from the measurement data as follows, $$x_i(x,y,z) = x_{i-1}(x,y,z) + \ln S_i(x,y,z) \cdot a_i^+ \quad (26)$$

wherein $a_i^+$ designates the i-th column of the pseudo-inverse matrix $A^+$. After the measurement has been completed with the last diffusion coding, the solution vector simultaneously exists.

A diagnostic magnetic resonance apparatus 1 with the basic components to determine a diffusion tensor will now be described according to the preceding explanation of the bases of two embodiments and using the schematic representation in FIG. 1. Suitable diagnostic magnetic resonance apparatuses are, for example, commercially available from Siemens Medical Solutions under the name Magneton Symphony, Magneton Avanto, Magneton Trio, Magneton Espree. The diagnostic magnetic resonance apparatus 1 has a basic field magnet 2 that generates a homogeneous magnetic field of high field strength. To excite and to acquire (receive) magnetic resonance signals, a radio-frequency system 4 is provided that is operated in a sequence determined by the strength of the basic magnetic field as well as the gyromagnetic ratio of the atomic nucleus used for imaging. Predominantly hydrogen nuclei (protons) that are present in large number in living tissue are used in medical imaging for magnetic resonance imaging and also for determination of the diffusion tensor. With a gradient field system 6, the nuclear spins are spatially-coded by switched magnetic gradient fields during the excitation, after the excitation and during reception (acquisition). A controller 8 (that is realized to the greatest possible extent via a computer architecture with corresponding software) controls the entire measurement workflow from the generation of the magnetic resonance examination signal in the examination region to the acquisition of the magnetic resonance signals radiated from the examination region again.

As mentioned in the preceding, the measurement sequences can be fashioned such that diffusion-weighted or diffusion-coded magnetic resonance signals are generated. The magnetic resonance apparatus is correspondingly fashioned in terms of its controller 8. Control data 10 for the gradient fields used for diffusion weighting are predetermined corresponding to the direction and strength of the diffusion coding. Magnetic resonance signals acquired from the examination region with the corresponding diffusion coding are here supplied as diffusion data 12 to an evaluation unit that calculates a diffusion tensor from a complete set of measured diffusion data, as is described in detail in the following.

After a start 20 of the measurement method, the control data are initially predetermined for a specific number of diffusion codings 22. In the method it is checked in parallel whether a condition number 24 of the control data used for the diffusion coding is sufficient in order to obtain a stable solution for the components of the diffusion tensor to be determined. The control data represent specifications for the strength, duration and the temporal interval of the gradient pulses used for diffusion coding, which are then converted by the magnetic resonance apparatus into a corresponding diffusion-weighted pulse sequence. The spatial coding of the diffusion signals ensues in a typical manner with gradient fields in the excitation, in the acquisition and in-between. The spatially-coded measurement data 12 determined for each diffusion coding are prepared regarding diffusion data in order to update intermediate diffusion data 28 and thus to generate current intermediate diffusion data 30 that take into account all previously-implemented diffusion codings. A value for the precision of the current intermediate diffusion data is also currently calculated as was explained in the preceding. Given the attainment of sufficient precision 31, the matrix of the intermediate diffusion data is inverted in order to then determine the components of the diffusion tensor 14.

The components of the diffusion tensor are then displayed in a known representation (for example by means of diffusion ellipsoids) on an image display device corresponding to the location in the examination region.

Although modifications and changes may be suggested by those skilled in the art, it is the intention of the inventors to embody within the patent-warranted hereon all changes and modifications as reasonably and properly come within the scope of their contribution to the art.

We claim as our invention:

1. A method for determining coefficients of a diffusion tensor by magnetic resonance to describe a diffusion process within an examination subject, comprising the steps of:
    acquiring spatially-resolved, diffusion-coded diffusion data from volume elements of an examination subject dependent on control data for different diffusion codings;
    generating intermediate diffusion data for each volume element from said diffusion data acquired with a first of said diffusion codings;
    successively determining updated intermediate diffusion data for each volume element from diffusion data acquired preceding said intermediate diffusion data and from current diffusion data acquired with a second of said diffusion codings; and
    automatically electronically determining components of a diffusion tensor from a latest of said updated intermediate diffusion data after multiple updates with respectively different diffusion codings.

2. A method as claimed in claim 1 comprising generating said intermediate diffusion data and determining said updated intermediate diffusion data with a normal equation technique using the Moore-Penrose pseudo-inverse.

3. A method as claimed in claim 1 comprising determining said updated intermediate diffusion data from preceding intermediate diffusion data by addition of incremental intermediate diffusion data thereto, determined from said current diffusion data.

4. A method as claimed in claim 3 comprising generating said incremental intermediate diffusion data from logarithmized data formed by the natural logarithm of said current diffusion data.

5. A method as claimed in claim 4 comprising, in the acquisition of said diffusion data, diffusion coding said diffusion data using diffusion gradient fields in respective directions that are independent of each other, said diffusion gradient fields being represented by a vector, and wherein the step of generating said incremental intermediate diffusion data comprises weighting said vector with said logarithmized data to obtain said incremental intermediate diffusion data.

6. A method as claimed in claim 1 comprising generating said intermediate diffusion data and determining said updated intermediate diffusion data using a singular-value decomposition technique.

7. A method as claimed in claim 1 comprising, in the acquisition of said diffusion data, diffusion coding said diffusion data using diffusion coded gradient fields in respective directions that are independent of each other, said gradient filed respectively having a diffusion-coding effect on said diffusion data, and wherein the step of determining said diffusion tensor comprises determining said diffusion tensor also dependent on said diffusion-coding effect.

8. A method as claimed in claim 1 comprising updating said control data contemporaneously with acquisition of said diffusion data.

9. A method as claimed in claim 1 comprising establishing a measurement workflow for acquiring said diffusion data, and determining said control data from said measurement workflow before acquiring said diffusion data.

10. A method as claimed in claim 1 comprising acquiring said diffusion data in a chronological order, by first acquiring diffusion data that have a strong influence on determining said components of diffusion tensor and thereafter acquiring diffusion data that have a weak influence on said components of said diffusion tensor.

11. A method as claimed in claim 1 comprising acquiring said diffusion data with at least seven different diffusion codings.

12. A method as claimed in claim 11 wherein one of said diffusion codings is zero.

13. A method as claimed in claim 1 comprising emitting a signal when said components of said diffusion tensor can be determined with a predetermined precision.

14. A method as claimed in claim 1 comprising terminating determination of said components of said diffusion tensor when a predetermined precision criterion is achieved for said components of said diffusion tensor.

15. A method as claimed in claim 1 comprising determining a performance of said components of said diffusion tensor and emitting an electrical output representing said performance as a quality measure.

16. A method as claimed in claim 1 comprising determining a condition number from said control data as a measure for determinability of said components of said diffusion tensor.

17. A method as claimed in claim 1 comprising graphically representing and displaying said components of said diffusion tensor.

18. An apparatus for determining coefficients of a diffusion tensor by magnetic resonance to describe a diffusion process within an examination subject, comprising:
    a magnetic resonance scanner operated by control data to acquire spatially-resolved, diffusion-coded diffusion data from volume elements of an examination subject dependent on said control data for different diffusion codings; and
    a computer supplied with said diffusion data that generates intermediate diffusion data for each volume element from said diffusion data acquired with a first of said diffusion codings, and that successively determines updated intermediate diffusion data for each volume element from diffusion data acquired preceding said intermediate diffusion data and from current diffusion data acquired with a second of said diffusion codings, and that automatically determines components of a diffusion tensor from a latest of said updated intermediate diffusion data after multiple updates with respectively different diffusion codings.

* * * * *